United States Patent
Ruoff et al.

(10) Patent No.: US 9,551,941 B2
(45) Date of Patent: Jan. 24, 2017

(54) ILLUMINATION SYSTEM FOR AN EUV LITHOGRAPHY DEVICE AND FACET MIRROR THEREFOR

(71) Applicant: Carl Zeiss SMT GmbH, Oberkochen (DE)

(72) Inventors: Johannes Ruoff, Aalen (DE); Ingo Saenger, Heidenheim (DE); Joerg Zimmermann, Aalen (DE); Daniel Kraehmer, Essingen (DE); Christoph Hennerkes, Huettlingen (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 44 days.

(21) Appl. No.: 14/796,164

(22) Filed: Jul. 10, 2015

(65) Prior Publication Data

US 2016/0004164 A1 Jan. 7, 2016

Related U.S. Application Data

(63) Continuation of application No. PCT/EP2014/052639, filed on Feb. 11, 2014.

(Continued)

(30) Foreign Application Priority Data

Feb. 22, 2013 (DE) .................. 10 2013 202 948

(51) Int. Cl.
*G03F 7/20* (2006.01)
*G02B 27/09* (2006.01)
*G02B 26/08* (2006.01)

(52) U.S. Cl.
CPC ....... *G03F 7/70158* (2013.01); *G02B 27/0905* (2013.01); *G02B 27/0933* (2013.01);
(Continued)

(58) Field of Classification Search
CPC ............ G02B 27/0977; G03F 7/70075; G03F 7/7015; G03F 7/70116; G03F 7/70158; G03F 7/702; G03F 7/70316; G03F 7/70108; G03F 7/70091
See application file for complete search history.

(56) References Cited

U.S. PATENT DOCUMENTS 6,392,792 B1 5/2002 Naulleau
6,833,904 B1 12/2004 Komatsuda
(Continued)

FOREIGN PATENT DOCUMENTS

CN 1350185 A 5/2002
CN 1576903 A 2/2005
(Continued)

OTHER PUBLICATIONS

International Search Report and Written Opinion for corresponding PCT Appl No. PCT/EP2014/052639, dated Jun. 4, 2014.
(Continued)

*Primary Examiner* — Michelle M Iacoletti
(74) *Attorney, Agent, or Firm* — Fish & Richardson P.C.

(57) ABSTRACT

The invention relates to an illumination system for an EUV lithography device, comprising: a first facet mirror having facet elements that reflect EUV radiation, and a second facet mirror having facet elements for reflecting the EUV radiation reflected by the first facet mirror onto an illumination field. At least one of the facet elements of the first facet mirror or of the second facet mirror is designed as a diffractive optical element for diffracting the EUV radiation. In particular, at least one of the facet elements of the second facet mirror is designed as a diffractive optical element for illuminating only a part of the illumination field. The invention also relates to an EUV lithography device comprising (Continued)

such an illumination system, and to a facet mirror comprising at least one diffractive facet element.

24 Claims, 3 Drawing Sheets

Related U.S. Application Data (60) Provisional application No. 61/767,986, filed on Feb. 22, 2013.

(52) U.S. Cl.
CPC ......... *G02B 27/0977* (2013.01); *G03F 7/702* (2013.01); *G03F 7/7015* (2013.01); *G03F 7/70075* (2013.01); *G03F 7/70091* (2013.01); *G03F 7/70108* (2013.01); *G03F 7/70116* (2013.01); *G03F 7/70316* (2013.01); *G02B 26/0833* (2013.01)

(56) References Cited

U.S. PATENT DOCUMENTS

| | | |
|---|---|---|
| 2002/0171922 A1 | 11/2002 | Shiraishi et al. |
| 2005/0024614 A1 | 2/2005 | Bakker |
| 2005/0270513 A1* | 12/2005 | Dierichs ............. G03F 7/70075 355/67 |
| 2005/0275818 A1 | 12/2005 | Singer |
| 2008/0049206 A1 | 2/2008 | Ossmann |
| 2008/0123807 A1 | 5/2008 | Warm et al. |
| 2009/0041182 A1 | 2/2009 | Endres et al. |
| 2010/0277708 A1 | 11/2010 | Fiolka et al. |
| 2010/0284064 A1 | 11/2010 | Kruizinga et al. |
| 2012/0262688 A1 | 10/2012 | De Vries et al. |

FOREIGN PATENT DOCUMENTS

| | | |
|---|---|---|
| CN | 101454724 A | 6/2009 |
| CN | 101727010 A | 6/2010 |
| CN | 101762987 A | 6/2010 |
| CN | 101903808 A | 12/2010 |
| CN | 202133858 U | 2/2012 |
| DE | 102007041004 A1 | 3/2009 |
| DE | 10 2011 082 065 A1 | 9/2012 |
| DE | 10 2011 084 650 A1 | 4/2013 |
| EP | 1927892 A | 6/2008 |
| JP | 2012-235046 A | 11/2012 |
| WO | WO 2007/128407 A | 11/2007 |
| WO | WO 2011/154244 A1 | 12/2011 |

OTHER PUBLICATIONS

P. Naulleau et al., "Diffractive optical elements and their potential role in high efficiency illuminators," EUV Workshop, Lawrence Berkeley National Laboratory (2008).

German Office Action and English translation thereof for corresponding DE Appl. No. 10 2013 202 948.9, 5 pages, dated Oct. 23, 2013.

Chinese office action and search report, with translation thereof, for corresponding CN Appl No. 20140009868.6, dated Aug. 3, 2016.

* cited by examiner

ILLUMINATION SYSTEM FOR AN EUV LITHOGRAPHY DEVICE AND FACET MIRROR THEREFOR

CROSS-REFERENCE TO RELATED APPLICATIONS

The present application is a continuation of, and claims benefit under 35 USC 120 to, international application PCT/EP2014/052639, filed Feb. 11, 2014, which claims benefit under 35 USC 119 of German Application No. 10 2013 202 948.9, filed Feb. 22, 2013. International application PCT/EP2014/052639 also claims priority under 35 USC 119(e) to U.S. Provisional Application No. 61/767,986, filed Feb. 22, 2013. The entire disclosure of international application PCT/EP2014/052639 is incorporated by reference herein.

BACKGROUND OF THE INVENTION

The invention relates to an illumination system for an EUV lithography device, comprising: a first facet mirror having facet elements that reflect EUV radiation, and a second facet mirror having facet elements for reflecting the EUV radiation reflected by the first facet mirror onto an illumination field of the illumination system. The invention also relates to an EUV lithography device comprising such an illumination system, and to a facet mirror comprising at least one diffractive facet element.

In illumination systems of EUV lithography devices, especially EUV projection exposure apparatuses, optical elements in the form of facet mirrors are used to generate a homogenization of the radiation generated by an EUV light source on an illumination field illuminated by the illumination system. In this case, a first facet mirror, which is also designated as field facet mirror, is typically used to generate secondary light sources in the illumination system. The second facet mirror is arranged at the location of the secondary light sources generated by the first facet mirror and is designated as pupil facet mirror. The facet elements of the second facet mirror serve for imaging the facet elements of the first facet mirror onto the illumination field. The geometry of the facet elements (e.g. square, rectangular, . . . ) of the first facet mirror therefore typically corresponds to the geometry of the illumination field.

When facet mirrors are used in EUV lithography devices, non-ideal imagings associated with light losses possibly occur on account of manufacturing errors during the production of the facet elements. What has a disadvantageous effect in this case is that the surface form of individual facet elements which is required for imaging or beam shaping cannot be produced precisely enough, or possibly can be produced only with very high expenditure, with conventional production methods.

OBJECT OF THE INVENTION

It is an object of the invention to develop an illumination system, an EUV lithography device comprising the illumination system, and a facet mirror in such a way that the illumination of the illumination field can be optimized.

SUBJECT MATTER OF THE INVENTION

The object is achieved in accordance with a first aspect via an illumination system of the type mentioned in the introduction wherein at least one of the facet elements of the first facet mirror or of the second facet mirror is designed as a diffractive optical element for diffracting the EUV radiation.

The invention proposes producing the required beam shaping of a facet element by diffraction, i.e. by the diffraction of the incident EUV radiation at a grating structure predefined by the facet element, rather than by a predefined, e.g. spherical, surface form. The producibility or the functionality of diffractive optical elements having a reflective effect including for radiation in the EUV wavelength range, i.e. at wavelengths of between approximately 5 nm and approximately 20 nm, was described by P. Naulleau et al., cf. the article "Diffractive optical elements and their potential role in high efficiency illuminators", 2008 EUV Workshop, Jun. 12, 2008, Lawrence Berkeley National Laboratory, which describes the realization of EUV phase masks. In one exemplary embodiment described therein, the substrate is provided with a binary (single-step) surface structure, to which a reflective multilayer coating is applied. A phase hologram can be generated by the layers of the multilayer coating being applied as conformally as possible.

The embodiment of a facet element as a diffractive optical element makes it possible to convert an (almost) arbitrary incident beam profile of the EUV radiation into a desired reflected, resp., diffracted beam profile. In particular, each facet element of one or both facet mirrors can be equipped with individually adapted diffractive properties in order to generate an ideal beam profile for each partial beam or channel of the illumination system. Since the beam shaping of the EUV radiation takes place via diffraction, the surface forms of the facet elements can be chosen such that the production thereof is simplified. A further advantage with the use of diffractive optical elements in an illumination system is that diffractive optical elements intermix the incident radiation in their active region and thus improve the homogenization or the uniformity of the illumination radiation. By way of example, a respective facet element of the first facet mirror can be used to illuminate a facet element—assigned thereto—of the pupil facet mirror as homogeneously as possible, for example with a "top hat" illumination distribution.

In an embodiment in accordance with the first aspect of the invention, at least one of the facet elements of the second facet mirror is designed as a diffractive optical element for illuminating only a part of the illumination field. The angular distribution or the pupil of the illumination field can in this way be chosen differently for different parts of the illumination field, that is to say that it is possible to generate an illumination field with a pupil that varies in a location-dependent manner over the illumination field. By way of example, in a central partial region of the illumination field it is possible to realize a pupil distribution in the manner of an X-dipole, i.e. a dipole which is oriented in the direction of the short side of the illumination field, while in the outer partial regions of the illumination field it is possible to realize a Y-dipole, i.e. a dipole which is oriented in the direction of the long side of the illumination field, or vice versa. In conventional illumination systems, by contrast, the entire illumination field is typically illuminated by a respective facet element of the pupil facet mirror.

In an EUV projection exposure apparatus in the manner of a wafer scanner, the illumination field is typically rectangular and has a high aspect ratio of e.g. 20:1, the short side running parallel to the scanning direction. As explained further above, the geometry of the facet elements of the field facet mirror generally corresponds to the geometry of the illumination field. If appropriate, however, with the use of diffractive facet elements at the pupil facet mirror it is possible to choose a geometry that deviates from the geometry of the illumination field, i.e. it is possible to choose a different aspect ratio for the field facet elements, if appropriate even a square geometry. In this way, it is possible, if appropriate, to reduce the size of the facet elements of the field facet mirror and/or the facet elements can be arranged at a smaller distance from the intermediate focus, or a higher number of facet elements can be realized with the same distance.

In one embodiment, the facet element is designed for illuminating a part of the illumination field, which part comprises at least two non-contiguous partial regions. The use of a diffractive optical element enables the simultaneous illumination of a part of the illumination field, which part comprises two (or possibly more) non-contiguous partial regions, specifically by the incident EUV radiation being diffracted into different orders of diffraction (e.g. $-1^{st}$ and $+1^{st}$ order of diffraction).

In one embodiment, the second facet mirror has a plurality of first facet elements for illuminating a first part of the illumination field and a plurality of second facet elements for illuminating a second part of the illumination field, the second part being different from the first part. It goes without saying that provision can also be made of third, fourth, . . . facet elements for illuminating a third, fourth, . . . part of the illumination field, wherein the parts of the illumination field can in each case differ from one another. The pupil facet mirror can be configured here in particular in such a way that the parts of the illumination field which are illuminated by different types of facet elements complement one another to form the total illumination field.

If appropriate, there can also be overlaps between the parts of the illumination field which are illuminated by the respective first, second, . . . facet elements of the pupil facet mirror. This is advantageous in particular for the case where three, in particular four or more different types of facet elements are provided at the pupil facet mirror, which can be selected, if appropriate, during exposure operation depending on the mask structure to be illuminated. If appropriate, also during scanning operation during the exposure the selection of the facet elements of the pupil facet mirror and thus the location-dependent pupil of the illumination field can be adapted to that partial region (strip) of the mask which is respectively to be imaged and which is currently situated in the illumination field.

In one advantageous embodiment, facet elements of the first facet mirror can be changed over between a first position for illuminating the first facet elements and a second position for illuminating the second facet elements. The facet elements of the first facet mirror are typically switchable between at least two (angular) positions in order to select in a targeted manner those (first or second) facet elements of the pupil facet mirror which serve for realizing the desired pupil shape in the illumination field. In this case, typically a plurality of switching positions (at least two) can be chosen, in which the radiation is incident at two (or more) different angles or (narrow) angular distributions. As a result of the targeted selection of the illumination of a first or second facet element, it is possible to vary the pupil in the illumination field in a location-dependent manner and adapt it e.g. to the mask structure that is respectively to be imaged.

In a further embodiment, the facet elements of the second facet mirror form a grid arrangement in which first facet elements alternate with second facet elements. It has proved to be advantageous if facet elements for illuminating different partial regions of the illumination field are arranged at a comparatively small distance from one another. In this way, the difference or the difference angle of the facet elements of the field facet mirror between the first position for illuminating the first facet elements of the pupil facet mirror and the second position for illuminating the second facet elements of the pupil facet mirror (and, if appropriate, third, fourth, . . . facet elements) is comparatively small. This is advantageous since the reflectivity of the facet elements of the field facet mirror is typically optimized only for a narrow angle-of-incidence range.

In a further embodiment, at least one of the facet elements is designed as a diffractive optical element for deflecting EUV radiation onto a radiation sensor. The diffractive optical element can be designed, in particular, to reflect only a part of the radiation power of the incident EUV radiation into a higher order of diffraction, while the main part of the radiation power is used for illuminating the illumination field. The radiation sensor detects the radiation intensity or the power of the incident EUV radiation and can serve for checking and, if appropriate, for regulating the power of an EUV light source disposed upstream of the illumination system.

In a further embodiment, at least one of the facet elements has, in particular all the facet elements have, a planar surface form. Facet elements having a (substantially) planar surface geometry can be produced with greater precision compared with other, e.g. spherical, surface forms. In the case of the spherical surface form typically used for the facet elements, there is possibly the problem in addition that adjacent facet elements can mutually shade one another in their adjacent edge regions. Within the meaning of this application, a planar surface form is understood to be a surface form in which the substrate used has a planar geometry before the surface structuring that is possibly carried out (see below).

In a further embodiment, at least one diffractive facet element has a substrate having a profiled surface and a multilayer coating for reflecting EUV radiation, the multilayer coating being applied to the substrate. The multilayer coating typically has a plurality of individual layers consisting of different materials, wherein typically alternating layers composed of two materials having different refractive indices are used. The layer thicknesses and the layer materials of the individual layers are adapted to the EUV radiation wavelength to be reflected at the facet element. In order to be able to use the facet element as a diffractive optical element, the latter has a profiled surface. The surface profile can be for example a binary profile, i.e. a profile having only one step or one step height.

In one development, the substrate has a multi-step surface profile. Via a two-, three-, four-, . . . , n-step surface profile, it is possible to approximate for example a sawtooth-like surface structure and thus the triangular geometry of a sawtooth or of a blazed grating. By choosing a suitable blaze angle adapted to the wavelength and the distance between the approximated sawtooth structures, it is possible to select in a targeted manner an order of diffraction into which the incident EUV radiation is reflected, in order to increase the diffraction efficiency. The blazed profile can be used for example to produce a diffractive optical element in the manner of a Fresnel lens, that is to say that the EUV radiation is deflected only into a single order of diffraction. For the beam shaping it is possible to use diffractive optical elements in which the at least two-step, preferably multi-step, surface profile is irregular and does not have a clearly defined periodicity, with the result that no discrete orders of diffraction can be distinguished. In the case of such a beam-shaping diffractive optical element, too, a multi-step surface profile can increase the diffraction efficiency.

In a further embodiment, at least one diffractive element has a grating structure, which is typically embodied as a profiled surface of the substrate, the grating structure having a lateral extent of the order of magnitude of the wavelength of the EUV radiation. For diffracting of the EUV radiation, the lateral extent of the grating structure (also referred to as a grating constant or pitch) is typically of the order of magnitude of the wavelength $\lambda$ of the reflected, resp., diffracted EUV radiation, i.e. the lateral extent of the grating structure typically does not exceed $50\times\lambda$, preferably $10\times\lambda$, more preferably $5\times\lambda$. As the wavelength of the EUV radiation is typically between 5 nm and 15 nm, the maximum lateral extent of the grating structure (grating constant) does not exceed 750 nm and is preferably 150 nm or less, in particular 75 nm or less. Of course, when the wavelength $\lambda$ of the EUV radiation is smaller than 15 nm, e.g. 13.5 nm, the lateral extent of the grating structure is reduced accordingly.

A further aspect of the invention relates to an EUV lithography device comprising an illumination system embodied as described above. As explained further above, the illumination system serves for illuminating as homogeneously as possible an image field in a plane in which a structure (mask) to be imaged is arranged. With the aid of the illumination system described here, an angular distribution dependent on the location or on a respectively illuminated part of the illumination field (location-dependent pupil) can be generated.

One aspect of the invention is realized in a facet mirror, in particular for an illumination system as described above, comprising: at least one diffractive facet element for reflecting EUV radiation, comprising: a substrate and a multilayer coating that reflects EUV radiation, the multilayer coating being applied to the substrate, wherein the at least one diffractive facet element is designed for diffracting the EUV radiation.

In one embodiment, the at least one diffractive facet element has a grating structure, typically being embodied as a profiled surface of the substrate, having a lateral extent of the order of magnitude of the EUV radiation. As indicated above, the lateral extent (grating constant or pitch) is typical $50\times\lambda$ or less, $10\times\lambda$ or less, in particular $5\times\lambda$ or less, wherein $\lambda$ designates the wavelength of the EUV radiation.

Preferably, the substrate has a multi-step surface profile. As a result of the multi-step surface profile, a sawtooth-like surface structure can be approximated or, in the case of gray-scale lithography (see below), a sawtooth-like surface structure can be produced in order to realize a diffractive optical element for example in the manner of a blazed grating and to increase the efficiency of the diffraction of the EUV radiation into a specific predefined order of diffraction. In order to realize a beam-shaping diffractive facet element, the multi-step surface profile can also be designed for approximating an aperiodic surface structure. The multi-step surface profile can be realized by the microstructuring of the surface for example with the aid of a lithographic method.

Preferably, the multi-step surface profile has at least two, preferably at least three or four steps having different step heights. The greater the number of steps or step heights, the better the desired surface profile can be approximated and the greater typically the diffraction efficiency of the diffractive facet element. In the extreme case, a (quasi-) continuous height profile or surface profile is also possible, wherein individual steps are no longer discernible. Such a surface profile can be produced with the aid of gray-scale lithography, for example.

In a further embodiment, the multilayer coating, for smoothing the multi-step surface profile, has at least 100 individual layers, preferably at least 120 individual layers, in particular at least 150 individual layers. In this case, an individual layer is understood to be a layer composed of a high refractive index or low refractive index material, the layer thickness and the layer material of the individual layer being coordinated with the EUV radiation wavelength to be reflected at the facet element. Additional layers of the multilayer coating, which are designed for example for preventing diffusion or for protecting the multilayer coating against contaminating substances present in the environment, are not regarded as individual layers within the meaning of this application.

By providing a sufficiently large number of individual layers, it is possible to realize a substantially continuous phase profile in the multilayer coating, with the result that, in particular in the case of surface structures which are designed for approximating a sawtooth-like surface structure in the manner of a blazed grating, the efficiency of the diffraction into the desired order of diffraction can be maximized. In this case, it is advantageous if the lateral extent of the grating structures, for example of the sawtooth-like surface structures, lies in a range significantly smaller than the wavelength of the EUV radiation, since the layer thicknesses of the individual layers lie approximately in this range and the individual layers grow conformally on structures having a lateral extent comparable to or significantly greater than the layer thickness.

The multilayer coating can be applied via a conventional coating method, i.e. in a planar manner. In particular, conventional deposition of the layer materials from the gas phase can be used for applying the multilayer coating. In addition or as an alternative to the smoothing by the layers of the multilayer coating, it is also possible to use a smoothing layer that is applied to the multi-step surface profile of the substrate. The smoothing layer is typically mechanically smoothed or polished, with the result that it has or approximates the desired surface profile. Conventional materials suitable for smoothing, for example Si or $SiO_2$, can be used as materials for the smoothing layer. In a subsequent step, the multilayer coating is applied to the smoothing layer.

If the facet mirror is used as a pupil facet mirror, it is possible, in particular, for the multi-step surface profile of the first facet elements, which are used for illuminating a first part of the illumination field, to differ from a multi-step surface profile of the second facet elements, which are used for illuminating the second part of the illumination field.

Typically, the surface profiles of the first and/or second facet elements also differ among one another, wherein a dedicated, individual surface profile can be defined in particular for each facet element. It goes without saying that, if appropriate, the grating period of the diffraction grating formed at the surface of the diffractive optical element is also dependent, if appropriate, on the location on the substrate surface, that is to say that it is not absolutely necessary for the substrate to have only a single period length that is constant over the surface. The same applies to the blaze angle of the sawtooth-like surface structure possibly approximated by the profiled surface. In particular, it is also possible to produce a surface profile in which there is no longer a uniform period length.

Further features and advantages of the invention are evident from the following description of exemplary embodiments of the invention, with reference to the figures of the drawing, which show details essential to the invention, and from the claims. The individual features can be realized in each case individually by themselves or as a plurality in any desired combination in a variant of the invention.

DRAWING

Exemplary embodiments are illustrated in the schematic drawing and are explained in the following description. In the figures.

In the following description of the drawings, identical reference signs are used for identical or functionally identical components.

Figure 1:
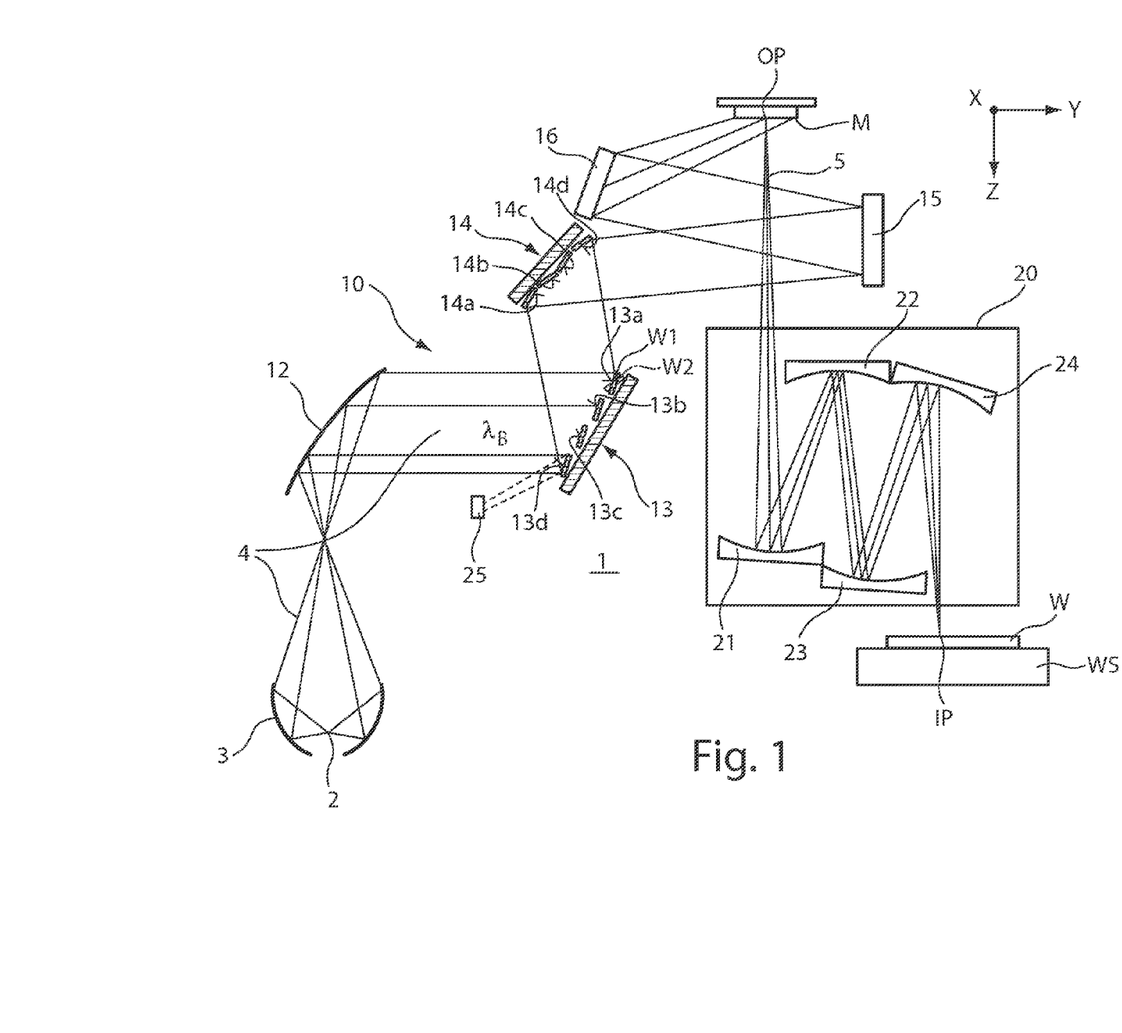
FIG. 1 shows a schematic illustration of an EUV lithography apparatus comprising an illumination system for illuminating an illumination field.

FIG. 1 schematically shows an EUV lithography apparatus 1. The latter comprises an EUV light source 2 for generating EUV radiation having a high energy density in an EUV wavelength range of below 50 nm, in particular between approximately 5 nm and approximately 15 nm. The EUV light source 2 can be embodied for example in the form of a plasma light source for generating a laser-induced plasma or as a synchrotron radiation source. In the former case, in particular, it is possible, as shown in FIG. 1, to use a collector mirror 3 in order to focus the EUV radiation of the EUV light source 2 to form an illumination beam 4 and, in this way, to increase the energy density further. The illumination beam 4 has a wavelength spectrum which is concentrated in a narrowband wavelength range around an operating wavelength $\lambda_B$, at which the EUV lithography apparatus 1 is operated. A monochromator 12 is used for selecting the operating wavelength $\lambda_B$ or for selecting the narrowband wavelength range.

The illumination beam 4 serves for illuminating a structured object M via an illumination system 10, which comprises four reflective optical elements 13 to 16 in the present example. The structured object M can be a reflective mask, for example, which has reflective and non-reflective or at least less reflective regions for producing at least one structure on the object M. Alternatively, the structured object M can be a plurality of micromirrors which are arranged in a one- or multidimensional arrangement and which, if appropriate, are movable about at least one axis in order to set the angle of incidence of the EUV radiation 4 on the respective mirror.

The structured object M reflects a part of the illumination beam 4 and shapes a projection beam 5, which carries the information about the structure of the structured object M and which is radiated into a projection lens 20, which generates an imaging of the structured object M or of a respective partial region thereof on a substrate W. The substrate W, for example a wafer, comprises a semiconductor material, e.g. silicon, and is arranged on a mount, which is also designated as a wafer stage WS.

In the present case, the first and second reflective elements 13, 14 in the illumination system 10 are embodied as facet mirrors and have a plurality of facet elements in the form of micromirrors arranged in a grid arrangement. FIG. 1 shows four facet elements 13a-d, 14a-d by way of example for each facet mirror 13, 14, at which facet elements the illumination beam 4 or a respective partial beam of the illumination beam 4 is reflected. The first optical element 13 is also designated hereinafter as field facet mirror 13 and serves for generating secondary light sources in the illumination system 10. The second optical element 14 is arranged at the location of the secondary light sources generated by the first optical element 13 and is also designated hereinafter as pupil facet mirror 14.

A partial beam of the illumination beam 4 which is incident on a respective facet element 13a-d of the field facet mirror 13 is deflected at the element onto a respective facet element 14a-d of the pupil facet mirror 14. The facet elements 13a-d of the field facet mirror 13 can be rectangular and have an aspect ratio (x:y) of e.g. 20:1, the X-direction running perpendicular to the plane of the drawing in FIG. 1. In this case, the aspect ratio of the facet elements 13a-d corresponds to the aspect ratio of the, for example rectangular, illumination field illuminated by the illumination system 10. It goes without saying that illumination fields and/or facet elements 13a-d having a different geometry from a rectangular geometry are likewise possible.

In the present example, each of the facet elements 13a-d of the field facet mirror 13 can be tilted about an axial direction parallel to the X-direction. In addition, a respective facet element 13a-d can, if appropriate, also be tiltable about a further axis, lying in the XZ-plane (plane of the drawing). The direction in which the illumination beam 4 is incident on the facet elements 13a-d can be set in this way. Via the tilting, in particular the assignment between the facet elements 13a-d of the field facet mirror 13 and the facet elements 14a-d of the pupil facet mirror 14 can also be varied in order to generate a desired illumination distribution (illumination pupil or angular distribution) at the location of the illuminated object M, as described in greater detail further below.

In general, in the case of a respective illumination mode or at a predefined point in time, a 1:1 assignment between the facet elements 13a-d of the field facet mirror 13 and the facet elements 14a-d of the pupil facet mirror 14 is chosen. However, if appropriate, an assignment can also be effected in such a way that two or more of the facet elements 13a-d of the field facet mirror 13 are assigned to a facet element 14a-d of the pupil facet mirror 14 in order to set different illumination modes. Details in this regard can be found in US 2009/0041182 A1 in the name of the present applicant, to which reference is made in its entirety.

In the case of the facet mirrors 13, 14 shown in FIG. 1, the facet elements 13a-d, 14a-d are embodied as diffractive optical elements, that is to say that the latter have diffractive grating structures in order to perform the desired beam shaping of the illumination beam 4 or of a respective partial beam of the illumination beam 4. Since the beam shaping is effected by diffractive structures, the surface form of the facet elements 13a-d, 14a-d can be chosen such that the latter can be manufactured in a simple manner. In the example shown, the facet elements 13a-d, 14a-d have a planar surface form or surface geometry. This surface form, firstly, can be produced easily and, secondly, prevents a partial mutual shading of the facet elements 13a-d, 14a-d of the respective facet mirrors 13, 14.

The diffractive structures of the facet elements 13a-d of the field facet mirror 13 are chosen in such a way that the latter generate a "top hat"-like profile of the respectively reflected partial beam of the illumination beam 4 and thus increase the uniformity of the illumination radiation 4 incident on a respective facet element 14a-d of the pupil facet mirror 14.

The diffractive structures of one of the facet elements 13d of the field facet mirror 13 are embodied such that a proportion of the intensity of the incident illumination beam 4 is diffracted into a higher order of diffraction, with the result that this proportion of the intensity is not incident on the pupil facet mirror 14, but rather on a radiation sensor 25. The radiation sensor 25 serves for measuring the intensity of the incident EUV radiation and can be used for checking the function of the EUV light source 2. It goes without saying that the measured radiation intensity can also be used for regulating the radiation power of the EUV light source 2, for example by the measurement signal of the radiation sensor 2 being fed to a control unit (not shown) for controlling or for regulating the operation of the EUV lithography device 1.

Figure 2:
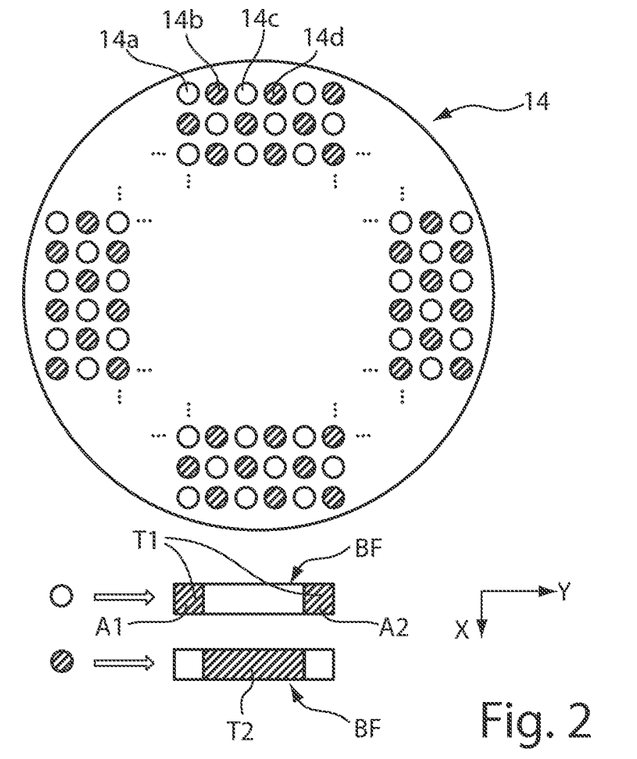
FIG. 2 shows a schematic illustration of a pupil facet mirror for the illumination system from FIG. 1 having first and second diffractive facet elements designed for illuminating different parts of the illumination field.

As a result of the embodiment of the facet elements 14a-d of the pupil facet mirror 14 as diffractive optical elements, a respective facet element 14a-d can illuminate in a targeted manner only a part of the rectangular illumination field BF which is shown in FIG. 2 and which is generated by the illumination system 10 in the plane with the structured object M. In the present example, a number of first facet elements 14a, 14c, . . . are designed for illuminating a first part T1 of the illumination field BF, while a number of second facet elements 14b, 14d, . . . serve for illuminating a second part T2 of the illumination field BF, wherein the first part T1 and the second part T2 cover the entire area of the illumination field BF.

As can likewise be discerned in FIG. 2, the first part T1 of the illumination field BF is composed of two non-contiguous partial regions A1, A2 formed at the left and right edges, respectively, of the illumination field BF. The simultaneous illumination of non-contiguous partial regions A1, A2 of the illumination field BF is possible since the first facet elements 14a, 14c, . . . are embodied as diffractive optical elements, in which the incident EUV radiation can be diffracted into different orders of diffraction and thus in different directions. The second, central part T2 of the illumination field BF, this part being illuminated by the second facet elements 14b, 14d, . . . , is embodied, by contrast, as a single, contiguous region.

As can likewise be discerned in FIG. 2, the first and second facet elements 14a-d of the pupil facet mirror 14 are arranged in a grid, wherein first facet elements 14a, 14c, . . . alternate with second facet elements 14b, 14d, . . . . This is advantageous in order to illuminate first facet elements 14a, 14c, . . . and respectively second facet elements 14b, 14d, . . . of the pupil facet mirror in a targeted manner with the aid of the facet elements 13a-d of the field facet mirror 13. As explained further above, for changing over between the illumination of a first facet element 14a, 14c, . . . of the pupil facet mirror 14 and the illumination of a second, adjacent facet element 14b, 14d, . . . of the pupil facet mirror 14, a respectively assigned facet element 13a, 13b, . . . of the field facet mirror 13 can be switched over between a first angular position W1 and a second angular position W2, as illustrated in FIG. 1 by way of example on the basis of a facet element 13a of the field facet mirror 13.

As a result of the adjacent arrangement of first and second facet elements 14a, 14b of the pupil facet mirror 14, the difference angle for switching over between the first angular position W1 and the second angular position W2 of a respectively assigned first facet element 13a is small, which has an advantageous effect on the reflectivity of the first facet element 13a, the reflectivity being optimized for a narrow angle-of-incidence range. Actuators that are known per se and are not described in more specific detail here can serve for switching over between the angular positions W1, W2 of the facet elements 13a-d of the field facet mirror.

The changeover between the two angular positions W1, W2 makes it possible to set in a targeted manner a pupil or angular distribution dependent on the location on the illumination field BF, as explained in greater detail below with reference to FIG. 3, which illustrates only those facet elements 14a, 14c, . . . of the pupil facet mirror 14 which are illuminated by the facet elements 13a, 13b, . . . of the field facet mirror 13. As can clearly be discerned, first facet elements 14a, 14c, . . . in an upper and lower region of the pupil facet mirror 14 are illuminated in the manner of a dipole field distribution. Since the spatial distribution on the pupil facet mirror 14 corresponds to the angular distribution (pupil) in the illumination field BF, a corresponding dipole (X-dipole) is generated in the first part T1 of the illumination field BF. At the same time the facet elements 13a, 13b, . . . of the field facet mirror 13 also illuminate second facet elements (not designated more specifically in FIG. 3) of the pupil facet mirror 14 that are arranged in a left and right partial region of the pupil facet mirror 14. The second facet elements of the pupil facet mirror 14 generate a pupil or an angular distribution in the manner of a Y-dipole in the second, central part T2 of the illumination field BF.

Figure 3:
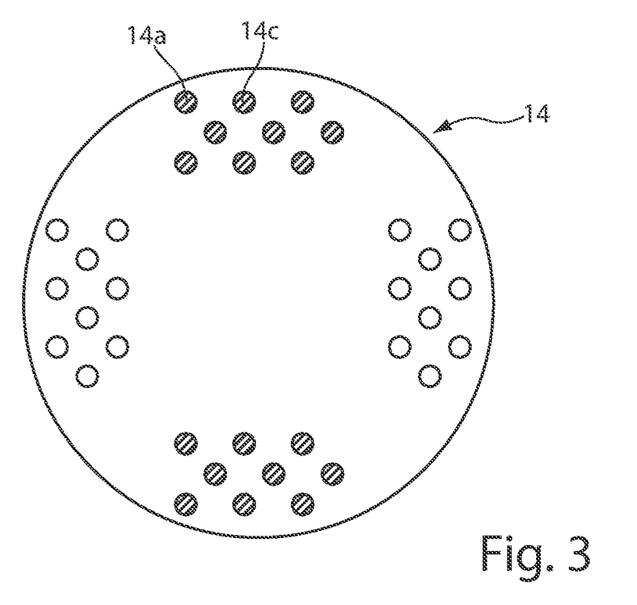
FIG. 3 shows an illustration of the pupil facet mirror from FIG. 2 for generating a field-dependent pupil illumination of the illumination field.

As shown by way of example with reference to FIG. 3, a different angular distribution or pupil can be generated via a suitable selection of first and second facet elements 14a-d of the pupil facet mirror 14 at different parts T1, T2 of the illumination field BF. In particular, angular distributions other than the X-dipole distribution and Y-dipole distribution described by way of example above can also be generated. It goes without saying that it is also possible to provide more than two different types of facet elements 14a-d at the pupil facet mirror 14 in order to illuminate more than two parts of the illumination field BF with different angular distributions or pupils.

Figure 4A:
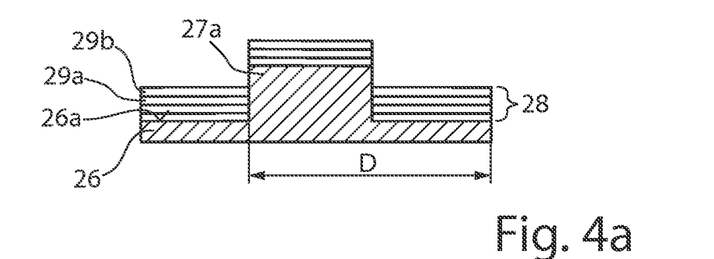
FIGS. 4a-c show three schematic illustrations of a substrate having a structured surface (grating structure) having a binary surface profile (FIG. 4a) and having a two- and respectively four-step surface profile for approximating a sawtooth-like surface structure (FIGS. 4b,c).
Figure 4B:
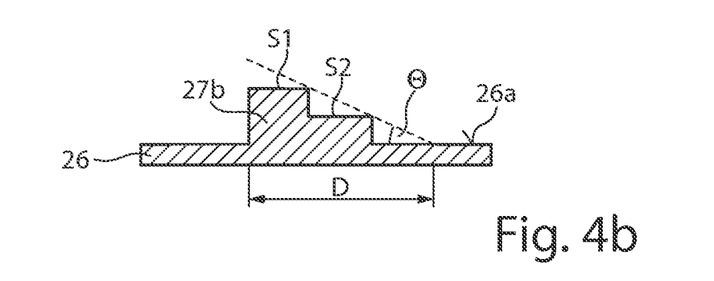
Figure 4C:
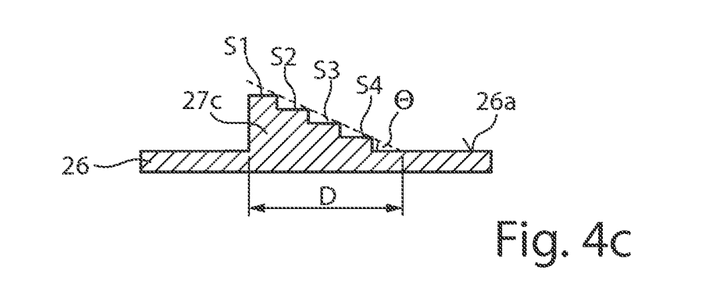

FIGS. 4a-c show three examples of a substrate 26 which can serve for producing a diffractive facet element 13a-d, 14a-d embodied as described above. The substrate 26 has a profiled surface 26a, to which a multilayer coating 28 is applied which is shown only in FIG. 4a for the sake of simplicity, the multilayer coating reflecting EUV radiation 4 at the operating wavelength $\lambda_B$. The reflective multilayer coating 28 has a plurality of individual layers 29a, 29b consisting of different materials. In the present example, the individual layers are formed alternately from materials having different refractive indices. If the operating wavelength $\lambda_B$ is approximately 13.5 nm, as in the present example, then the individual layers 29a, 29b usually consist of molybdenum and silicon. Other material combinations such as e.g. molybdenum and beryllium, ruthenium and beryllium or lanthanum and $B_4C$ are likewise possible depending on the operating wavelength $\lambda_B$.

In the case of the substrate 26 shown in FIG. 4a, the profiled surface 26a has a single-step surface profile 27a, that is to say that one rectangular or parallelepipedal step is formed on the otherwise planar surface 26a. It goes without saying that only a detail or a partial region of the substrate 26 is shown in FIG. 4a, and that the partial region having a lateral extent D shown in FIG. 4a is repeated periodically in order to form a grating structure on the profiled surface 26a.

The same applies to the profiled surfaces 26a shown in FIG. 4b and in FIG. 4c, in the case of which a substrate 26 having a two-step surface profile 27b and a four-step surface profile 27c, respectively, are shown. The steps S1 and S2 of the two-step surface profile 27b in FIG. 4b have a different step height and together with the planar section of the surface 26a approximate a sawtooth profile, i.e. a triangular profile with lateral extent D forming an oblique step inclined at the so-called blaze angle θ relative to the planar section of the surface 26a of the substrate 26. The sawtooth-like surface profile of a blazed grating and thus the selectivity of the grating for the diffraction into a specific order of diffraction can be approximated all the better, the greater the number of steps of the surface profile, that is to say that the surface profile 27c having four steps S1 to S4 that is shown in FIG. 4c enables an improved approximation of the sawtooth profile.

The surface profiles 27a-c, which are periodic in the present example, can be produced via a microstructuring of the substrate 26, for which purpose a lithographic method, in particular, is suitable. During the lithographic microstructuring, firstly a photoresist is applied to the planar surface 26a of the substrate 26. In a subsequent step, the photoresist is exposed in a lithography apparatus in order to transfer a desired structure into the photoresist. The photoresist is subsequently developed, and in the process acquires a typically two-step profile corresponding to the desired structure. In a further step, the profile of the photoresist is transferred to the substrate 26 by etching. In order to produce a multi-step surface profile 27b, 27c this process can be repeated a number of times, if appropriate. It goes without saying that as an alternative to producing a periodic surface profile, as described in connection with FIGS. 4a-c, it is also possible to produce an aperiodic surface profile, in which no strictly periodic structures are discernible. Alternatively, the surface profile can also be structured by gray-scale lithography, whereby the production of a (quasi-)continuously variable profile is made possible. The surface profile 27b, 27c can be smoothed by the application of the multilayer coating 28, with the result that a substantially triangular or sawtooth-like surface profile arises at a free interface at the top side of the multilayer coating 28.

The multilayer coating 28, to put it more precisely the individual layers 29a, 29b, are typically applied to the substrate 26 in a planar manner in a conventional coating method—typically by vapor deposition. The lateral extent D of the one-step profile 27a and of the multi-step surface profiles 27b, 27c, respectively, should be approximately of the order of magnitude of the wavelength of the EUV radiation used, possibly significantly smaller than the wavelength of the EUV radiation used. For diffracting of the EUV radiation, the lateral extent D of the grating structures 27a-c should typically not exceed $50 \times \lambda_B$, preferably $10 \times \lambda_B$, in particular $5 \times \lambda_B$, the operating wavelength $\lambda_B$ being 13.5 nm in the present example.

In addition to the individual layers 29a, 29b described further above, the reflective multilayer coating 28 can also comprise intermediate layers for preventing diffusion. The reflective multilayer coating 28 typically also has a capping layer in order to prevent oxidation of the underlying individual layers 29a, 29b. Metallic materials such as ruthenium, rhodium, palladium, platinum, iridium, niobium, vanadium, chromium, zinc or tin can be used as the capping layer. The illustration of the auxiliary layers and of the capping layer in the figures was dispensed with in order to simplify the illustration. For the purpose of smoothing, it is also possible to apply a smoothing layer (not shown) to the top side 26a of the substrate 26, which smoothing layer can be formed from Si or $SiO_2$, for example, and is polished (mechanically) to the blaze angle θ, with the result that it approximates or produces the desired surface profile.

In the exemplary embodiments illustrated in FIGS. 4a-c, the substrate 26 has a planar surface form (apart from the grating structure). It goes without saying, however, that the substrate 26 can, if appropriate, also have a curved surface form, e.g. concave surface forms or convex surface forms being possible, which can be designed either in a spherical fashion or in an aspherical fashion. However, a planar surface 26a can be produced particularly simply, and so such a surface form is preferred relative to other surface forms that are more difficult to produce.

It goes without saying that the diffractive optical elements having a multi-step surface profile 27b, 27c as described here can be used not only as facet elements 13a-d, 14a-d of facet mirrors 13, 14 for the illumination system 10 described in connection with FIG. 1 to FIG. 3, but they can also be advantageously used in other devices for reflecting, resp., for diffracting EUV radiation.

The invention claimed is:

1. An illumination system, comprising:
   a first facet mirror comprising facet elements configured to reflect EUV radiation;
   a second facet mirror comprising facet elements configured to: a) reflect the EUV radiation after the EUV radiation reflects from facet elements of the first facet mirror; and b) reflect the EUV radiation onto an illumination field of the illumination system,
   wherein:
   a first facet element is a diffractive optical element configured to diffract the EUV radiation;
   the first facet element is a facet element of the first facet mirror or the second facet mirror;
   a second facet element is configured to illuminate only a part of the illumination field;
   the second facet element is a facet element of the second facet mirror; and
   the illumination system is an EUV lithography illumination system.

2. The illumination system of claim 1, wherein the part of the illumination field comprises first and second partial regions of the illumination field, and the first partial region is non-contiguous with the second partial region.

3. The illumination system of claim 2, wherein:
   a first plurality of the facet mirrors of the second facet mirror are configured to illuminate the first partial region;
   a second plurality of facet elements of the second facet mirror are configured to illuminate the second partial region; and
   the first plurality of facet elements of the first facet mirror is different from the second plurality of facet elements of the second facet mirror.

4. The illumination system of claim 3, wherein:
   the facet elements of the first facet mirror are switchable between first and second positions;
   in the first position, the facet elements of the first face mirror are configured to reflect the EUV radiation onto the first plurality of facets of the second facet mirror; and
   in the second position, the facet elements of the first facet mirror are configured to reflect the EUV radiation onto the second plurality of facets of the second facet mirror.

5. The illumination system of claim 4, wherein the facet elements of the second facet mirror define a grid arrangement in which facet elements of the first plurality of facet elements alternate with facet elements of the second plurality of facet elements.

6. The illumination system of claim 5, wherein the first diffractive facet element comprises:
   a substrate comprising a profiled surface; and
   a multilayer coating supported by the profiled surface, the multilayer coating configured to reflect EUV radiation.

7. The illumination system of claim 2, wherein:
   the facet elements of the first facet mirror are switchable between first and second positions;
   in the first position, the facet elements of the first face mirror are configured to reflect the EUV radiation onto a first plurality of facets of the second facet mirror;
   in the second position, the facet elements of the first facet mirror are configured to reflect the EUV radiation onto a second plurality of facets of the second facet mirror; and
   the first plurality of facet elements of the second face mirror is different from the second plurality of facet elements of the second facet mirror.

8. The illumination system of claim 7, wherein the facet elements of the second facet mirror define a grid arrangement in which facet elements of the first plurality of facet elements alternate with facet elements of the second plurality of facet elements.

9. The illumination system of claim 2, wherein the first facet element is a diffractive optical element configured to deflect EUV radiation onto a radiation sensor.

10. The illumination system of claim 2, wherein at least one of the facet elements comprises a planar surface.

11. The illumination system of claim 2, wherein the first facet element comprises:
    a substrate comprising a profiled surface; and
    a multilayer coating supported by the profiled surface, the multilayer coating configured to reflect EUV radiation.

12. The illumination system of claim 11, wherein the profiled surface comprises a multi-step surface profile.

13. The illumination system of claim 2, wherein the first facet element comprises a grating structure having a lateral extent of the order of magnitude of a wavelength of the EUV radiation.

14. The illumination system of claim 1, wherein the first facet element is the same as the second facet element.

15. The illumination system of claim 1, wherein the first facet element is different from the second facet element.

16. The illumination system of claim 15, wherein the first facet element is a facet element of the second facet mirror.

17. The illumination system of claim 1, wherein the first facet element is a facet element of the first facet mirror.

18. The illumination system of claim 1, wherein the first facet element is configured to deflect EUV radiation onto a radiation sensor.

19. The illumination system of claim 1, wherein at least one of the facet elements comprises a planar surface.

20. The illumination system of claim 1, wherein the first diffractive facet element comprises:
    a substrate comprising a profiled surface; and
    a multilayer coating supported by the profiled surface, the multilayer coating configured to reflect EUV radiation.

21. The illumination system of claim 20, wherein the profiled surface comprises a multi-step surface profile.

22. The illumination system of claim 1, wherein the first facet element comprises a grating structure having a lateral extent of the order of magnitude of a wavelength of the EUV radiation.

23. A lithography device, comprising:
    an illumination system according to claim 1; and
    a projection lens,
    wherein the lithography device is an EUV lithography device.

24. A method of using an EUV lithography device comprising an illumination system and a projection lens, the method comprising:
    using the illumination system to illuminate a portion of a structured object; and
    using the projection lens to image at least a portion of the illuminated structured object onto a substrate,
    wherein the illumination system comprises an illumination system according to claim 1.

* * * * *

UNITED STATES PATENT AND TRADEMARK OFFICE
CERTIFICATE OF CORRECTION

PATENT NO. : 9,551,941 B2
APPLICATION NO. : 14/796164
DATED : January 24, 2017
INVENTOR(S) : Johannes Ruoff et al.

It is certified that error appears in the above-identified patent and that said Letters Patent is hereby corrected as shown below:

In the Claims

Column 12, Line 61, Claim 4, delete "face" and insert -- facet --.

Column 13, Line 14, Claim 7, delete "face" and insert -- facet --.

Column 13, Line 21, Claim 7, delete "face" and insert -- facet --.

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*